(12) United States Patent
Lin

(10) Patent No.: US 7,654,830 B2
(45) Date of Patent: Feb. 2, 2010

(54) IC SOCKET HAVING DETACHABLE ALIGNING ELEMENT

(75) Inventor: Wei-Chih Lin, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/384,080

(22) Filed: Mar. 31, 2009

(65) Prior Publication Data

US 2009/0246982 A1 Oct. 1, 2009

(30) Foreign Application Priority Data

Mar. 31, 2008 (TW) .............................. 97205437 U

(51) Int. Cl.
*H01R 12/00* (2006.01)
(52) U.S. Cl. ....................................................... 439/71
(58) Field of Classification Search ................... 439/68, 439/74, 72, 71, 526
See application file for complete search history.

(56) References Cited

U.S. PATENT DOCUMENTS

| | | |
|---|---|---|
| 5,247,250 A | 9/1993 | Rios |
| 6,217,341 B1 * | 4/2001 | Glick et al. .................... 439/66 |
| 6,368,137 B1 * | 4/2002 | Orwoll ........................ 439/331 |
| 7,083,456 B2 * | 8/2006 | Trout et al. .................. 439/326 |
| 7,204,708 B2 * | 4/2007 | Sato et al. .................... 439/259 |
| 7,207,808 B2 * | 4/2007 | Ma .............................. 439/71 |
| 7,230,830 B2 * | 6/2007 | Ujike et al. .................. 361/704 |
| 2008/0311770 A1 * | 12/2008 | Fan .............................. 439/68 |

FOREIGN PATENT DOCUMENTS

JP  H10-125426  5/1998

* cited by examiner

*Primary Examiner*—Neil Abrams
*Assistant Examiner*—Phuong Nguyen
(74) *Attorney, Agent, or Firm*—Andrew C. Cheng; Wei Te Chung; Ming Chieh Chang

(57) ABSTRACT

An IC socket includes a socket body defining a first receiving cavity with a bottom wall, a cover attached pivotally on one end of the socket body and a locking member for locking the cover to the socket body. The IC socket further includes four detachable aligning elements mounted on four corners of the bottom wall. The four aligning elements have a plurality of positioning surfaces adapted for corporately defining a second receiving cavity for snugly accommodating an IC package therein. Different aligning elements with different dimensions can be replaced to mount on the socket body for different IC packages, thus a cost of manufacturing is reduced.

11 Claims, 6 Drawing Sheets

IC SOCKET HAVING DETACHABLE ALIGNING ELEMENT

BACKGROUND OF THE INVENTION

1. Field of the Invention

The present invention relates to an IC socket, and more particularly, to an IC socket having a plurality of aligning elements adapted to corporately define a receiving cavity for snugly accommodating the IC package therein.

2. Description of the Related Art

Electronic packages, such as integrated circuits (IC) packages, are miniaturized electronic devices in which a number of active and passive circuit elements are located on or within a continuous body of material to perform the function of a complete circuit. To ensure reliability in use, the IC packages require prior burning in to test their durability. The IC packages are operated at high temperature for an extended period of time to accelerate potential failure points. This helps eliminate early product failures once the IC packages are sold and/or assembled onto electronic end products. Thus, an IC socket is used to receive the IC package therein, and to electrically connect the IC package with a burn-in board for operation of the IC package at a high temperature.

The conventional IC socket, such as disclosed in Japanese patent application publication NO. H10-125426 and U.S. Pat. No. 6,877,990, typically comprises an insulative housing with a plurality of terminals received therein, a cover pivotally attached to one end of the insulative housing and defining an open position and a closed position, and a locking member mounted on one end of the cover and having a latch locked with the insulative housing. The insulative housing defines a receiving space having interior positioning walls for snugly accommodating the IC package therein. In use, the cover is firstly rotated to the vertical open position, and the IC package is seated into the receiving space of the insulative housing. Then the cover is rotated to the horizontal closed position and locked by the locking member engaging with the insulative housing. At last, the IC package is placed on the terminals and sandwiched between the insulative housing and the cover.

However, the IC socket mentioned-above can only match with one given type of IC package, so different types of chips need corresponding types of IC sockets. It increases the manufacturing cost of applying corresponding IC sockets. On the other hand, the IC socket is usually molded by a particular socket die. To reduce the cost of manufacturing, the particular socket die can be readily modified to accommodate another type of IC socket for another type of IC package. But this method may take a plenty of time and expense.

In view of the above, an improved IC socket which overcomes the above-mentioned disadvantages is desired.

SUMMARY OF THE INVENTION

Accordingly, an object of the present invention is to provide an IC socket having a plurality of aligning elements adapted to corporately define a receiving cavity for snugly accommodating the IC package therein.

To achieve the above-mentioned object, an IC socket in accordance with the present invention, for interconnecting an IC package and a circuit substrate, comprises an insulative housing, a plurality of terminals disposed in the insulative housing, a cover mounted on the insulative housing and a locking member mounted on the cover. The insulative housing includes a bottom with a top surface, a first end and an opposite second end along a front-to-back direction. The terminals have contacting sections extending beyond the top surface of the bottom of the insulative housing, and the cover is pivotally engaged on the first end of the insulative housing. The locking member is engaged on a free end of the cover and has a claw which can be locked to the insulative housing. Moreover, a plurality of detachable aligning elements are disposed on the insulative housing with positioning surfaces adapted to corporately define a receiving cavity for snugly accommodating an IC package therein.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Reference will now be made to the drawings to describe the present invention in detail.

Figure 1:
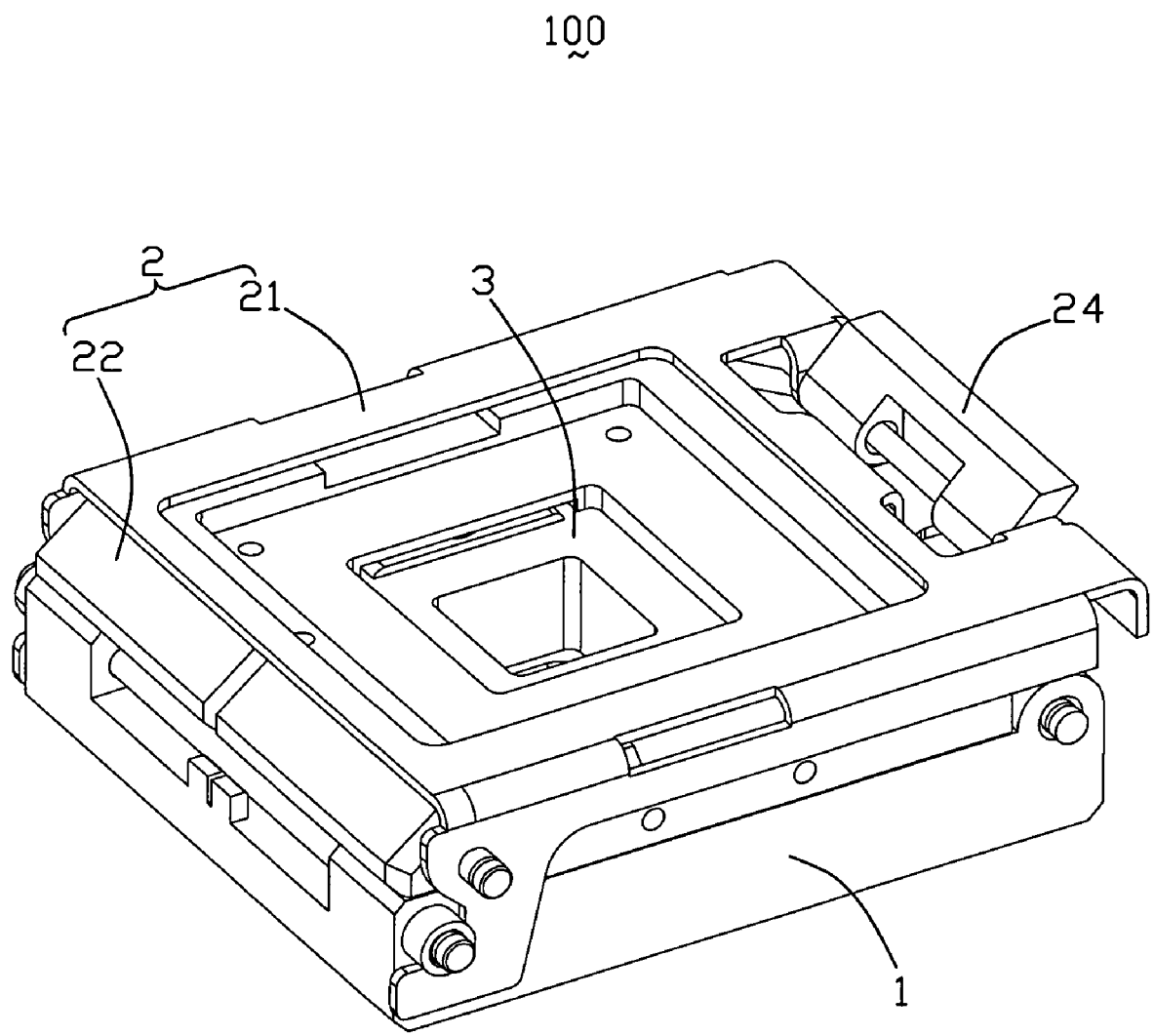
FIG. 1 is an assembled, perspective view of an IC socket in accordance with a preferred embodiment of the present invention.
Figure 2:
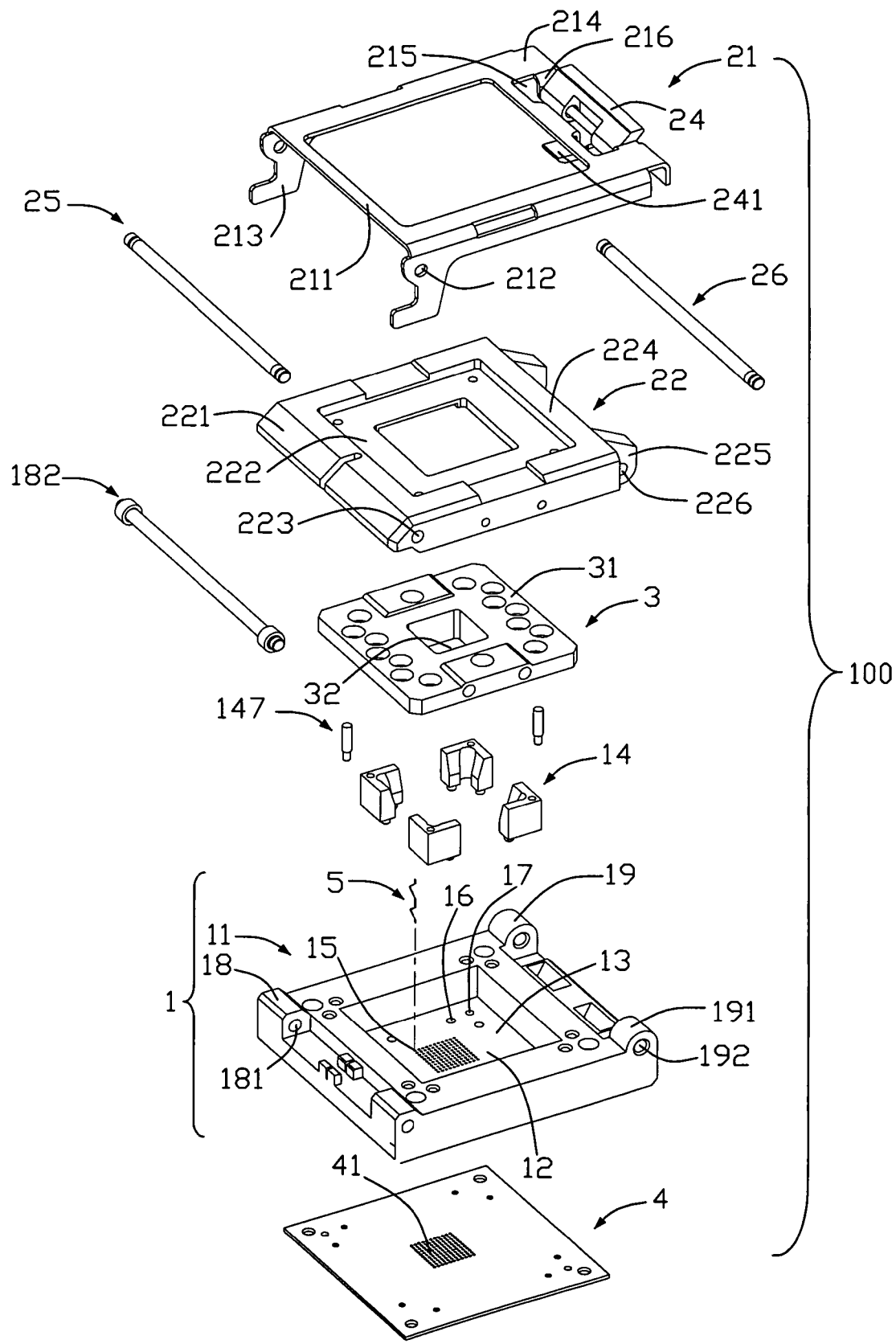
FIG. 2 is an exploded, perspective view of the IC socket shown in FIG. 1.
Figure 3:
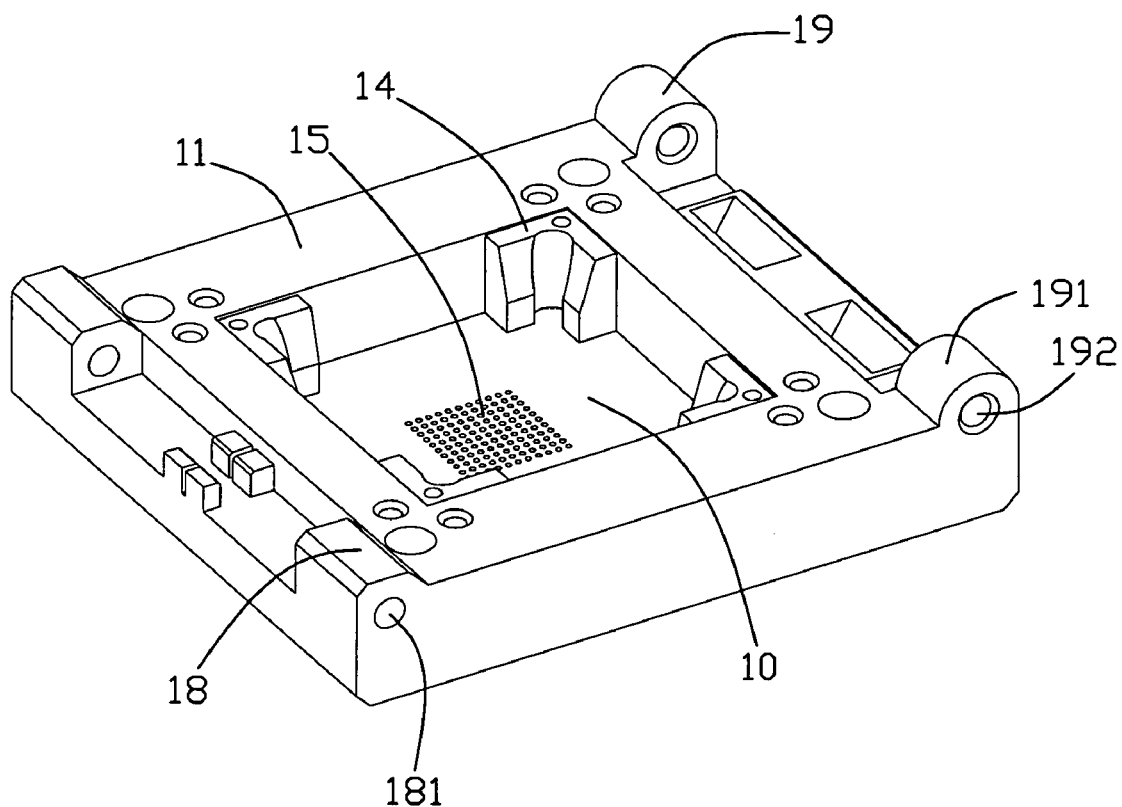
FIG. 3 is a partially assembled view of the IC socket shown in FIG. 1.
Figure 4:
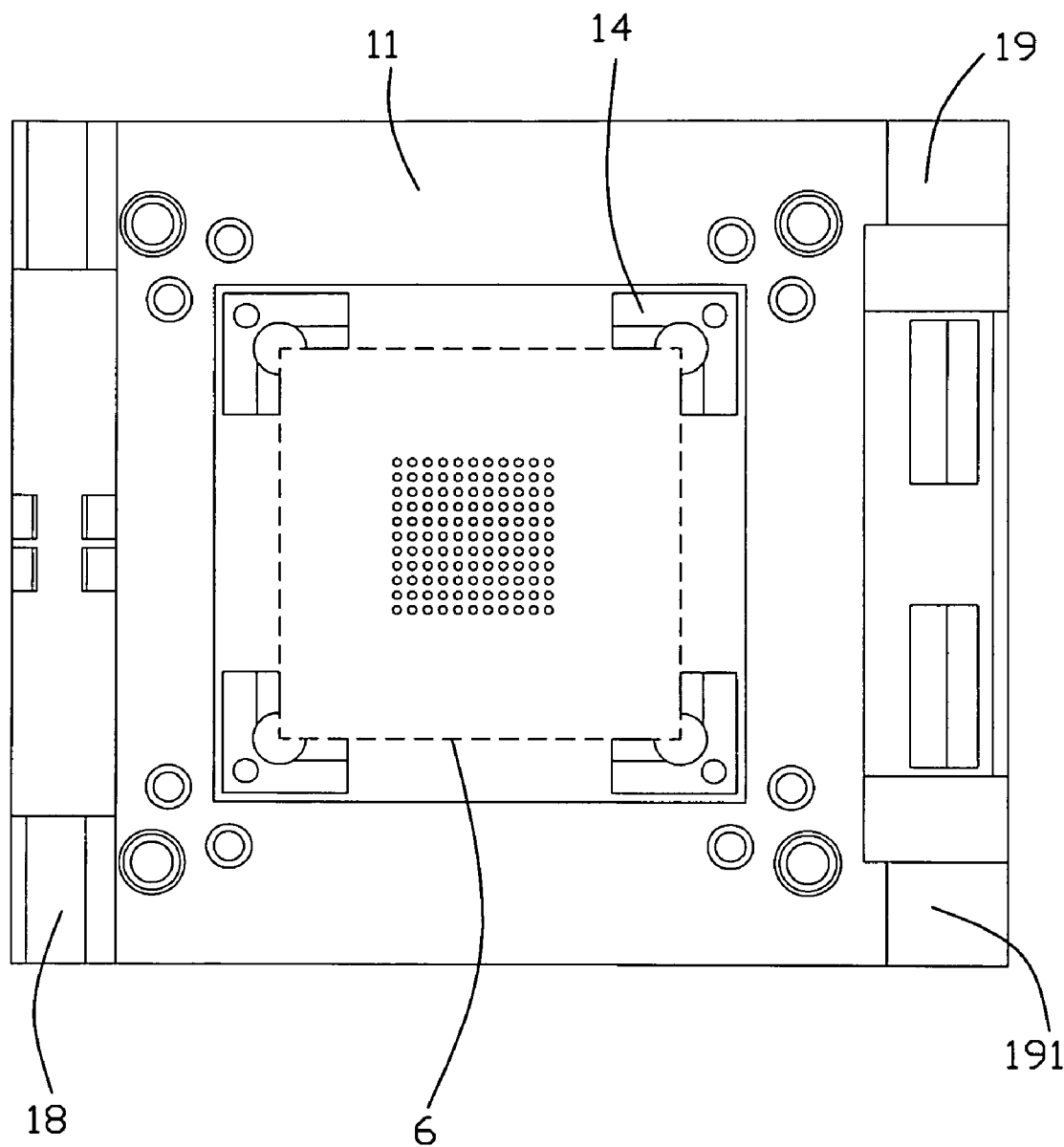
FIG. 4 is a top plan view of the above with an IC package loaded therein.
Figure 5:
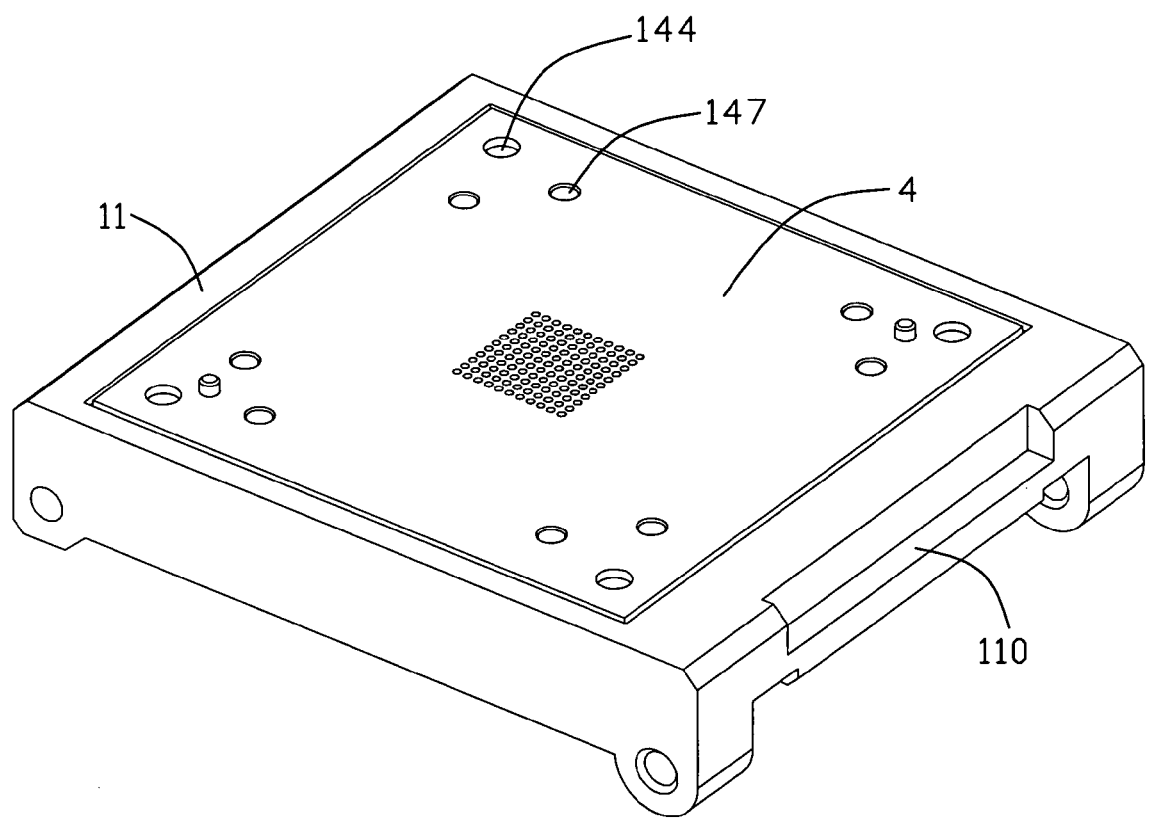
FIG. 5 is similar to FIG. 3, but taken from another side.

Referring to FIGS. 1-5, a preferred embodiment of an IC socket 100 for testing an IC package 6 according to the present invention is shown, which includes a socket body 1, a cover 2 pivotally engaged with an end of the socket body 1 so as to be rotatable with respect to the socket body 1, and a locking member 24 assembled on a free end of the cover 2.

The socket body 1 includes an insulative housing 11 and a plurality of terminals 5 received in the insulative housing 11. The insulative housing 11 is generally of a rectangular shape, preferably made from insulative material. In the preferred embodiment, the socket body 11 includes a first rectangular receiving cavity 12 formed in the center thereof, and two opposite longitudinal ends 18, 19 that are separated by the first receiving cavity 12 along a front-to-back direction. The first longitudinal end 18 of the socket body 11 defines two longitudinally extending holes 181 for a corresponding crossbar 182 to penetrate therethrough. A pair of spaced ribs 191 is arranged on the second longitudinal end 19, with another a pair of longitudinally extending holes 192 formed on each of the ribs 191 to cooperatively allow a first holding shaft 26 to penetrate therethrough. Moreover, a plurality of passageways 15 are defined in a center of a bottom wall 13 below the first receiving cavity 12 for receiving the terminals 5, and each terminal 5 has a contacting section extending upwardly beyond a top surface of the bottom wall 13 into the first receiving cavity 12 to have the IC package 6 loaded thereon.

In the preferred embodiment, the cover 2 includes a lower cover 22 and a upper cover 21 pivotally mounted on a front end 221 of the lower cover 22. The lower cover 22 is preferably made of insulative material, and is configured to have a rectangular shape in compliance with the socket body 11. The lower cover 22 includes a receiving region 222 in the center thereof for mounting a heatsink (not shown), the front end 221 with a longitudinally extending hole 223 therein to allow a second holding shaft 25 to penetrate therethrough so as to form a pivotal connection between the lower cover 22 and the upper cover 21, and a rear end 224 opposite to the front end 221 and with a pair of outwardly projecting portions 225 with holes 226 therein to cooperatively allow for the first holding shaft 26 to penetrate therethrough so as to form a pivotal connection between the lower cover 22 and the second end 19 of the socket body 11.

The upper cover 21 is generally of a rectangular shape, preferably made of metallic material. A front region 211 of the upper cover 21 is formed with a pair of holes 212 to cooperatively allow the second holding shaft 25 to penetrate in sequence through the extending hole 223 of the lower cover 22 and the holes 212, thereby forming a pivotal connection between the upper cover 21 and the lower cover 22 via the second holding shaft 25. And a pair of L-shaped hooks 213 adjacent the holes 212 are configured to extend downwardly and slightly outwardly from the front region 211 to grip ends of the crossbar 182 assembled to the first end 18 of the insulative housing 11, so as to retain the cover 2 to the socket 1. The upper cover 21 has a rear opposite region 214 opposite to the front region 211, and the rear region 214 defines a slit 215 at middle thereof with a pair of extending downwardly portions 216 formed at opposite interior edges of the slit 215. The locking member 24 is held by the downwardly extending portions 216 so as to be pivotally or rotatably relative to the rear end 214 of the upper cover 21, thereby achieving effective engagement between two claws 241 of the locking member 24 and a slot 110 of the insulative housing 11 by pivotal movement of the locking member 141 towards the second end 19 of the insulative housing 11.

Furthermore, the IC socket 100 further includes a pressing member 3 movably mounted on the lower cover 22 and a substrate board 4 assembled to a lower surface of the socket body 1. The pressing member 3 includes a planar base 31 and an opening 32 in a center of the base 31 corresponding to the first receiving cavity 12 so as to make the IC packet be loaded in the socket body 1 to be exposed to the heatsink (not shown). The substrate board 4 also defines a plurality of through holes 41 in alignment with the corresponding passageways 15 of the insulative housing 11 for receiving and protecting tails of the terminals 5.

Figure 6:
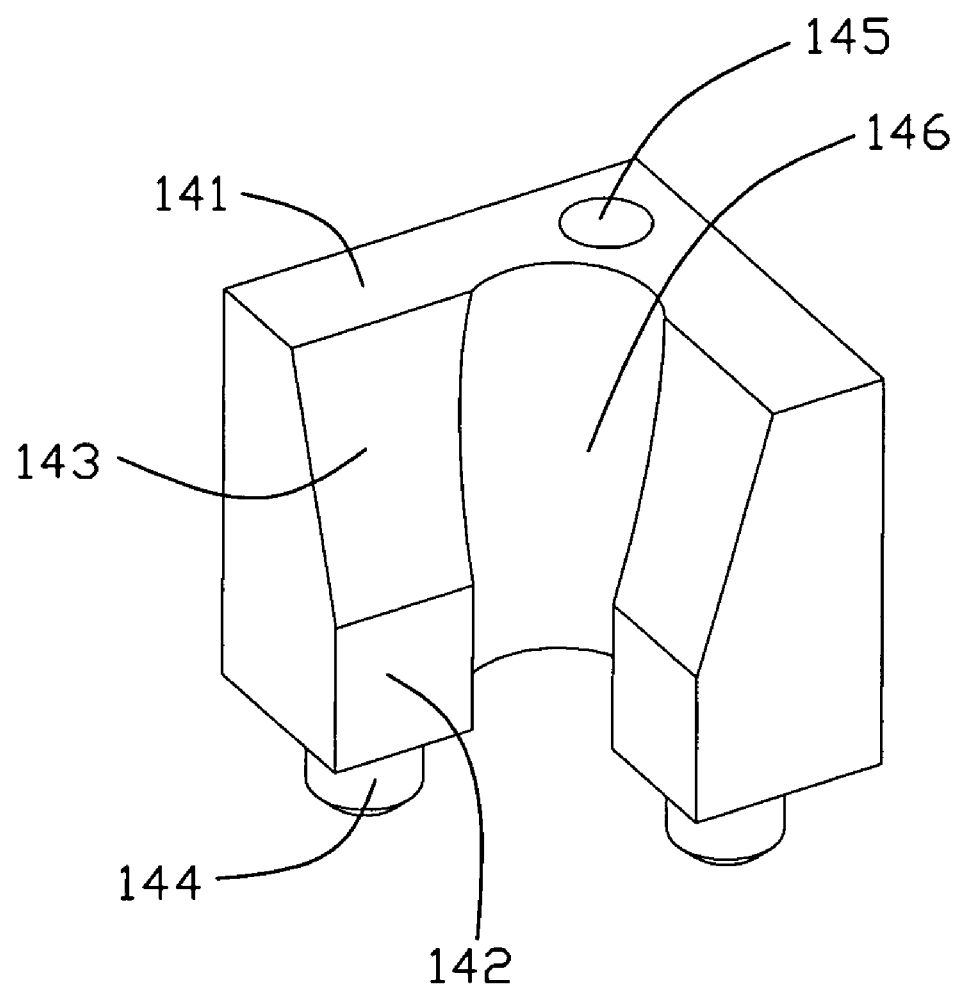
FIG. 6 is a perspective view of an aligning element of the IC socket.

Now, referring particularly to FIGS. 2 to 6, the insulative housing 11 further has four detachable aligning elements 14 disposed in the first receiving cavity 12 in alignment with one another to commonly define a second receiving cavity 10 for snugly accommodating the IC package 6 therein. The four aligning elements 14 are assembled on four corner regions of the bottom wall 13 surrounding the passageways 15, respectively. Each corner region of the bottom wall 13 defines two positioning holes 16 and a thread hole 17 for corporately retaining the aligning element 14.

In the preferred embodiment, the aligning elements 14 are made of insulative material and have a substantially V-shaped configuration. Each aligning element 14 includes two vertical legs 141 substantially perpendicular to each other, and each leg 141 has an interior lower vertical positioning surface 142 and an upper sloped leading surface 143 connecting with the positioning surface 142. Each aligning element 14 further has two posts 144 extending downwardly from bottom surfaces of the legs 141 for being inserted into corresponding positioning holes 16 in the bottom wall 13 of the insulative housing 11. Moreover, a vertical through hole 145 is defined in corner region of the aligning element 14 between the two legs 141, and a recessed portion 146 is defined adjacent to the through hole 145 to reduce a stress between the two legs 141. To assemble the aligning element 14 into the socket body 1, the posts 144 are first interferentialy inserted into the corresponding positioning holes 16 of the insulative housing 11, then a fixing pin 147 passes through the through hole 145 into the thread hole 17 of the insulative housing 11, the aligning elements 14 are finally assemble on the bottom wall 13 of the insulative housing 11, thus a second receiving cavity 10 is formed corporately by all the positioning surfaces 142 of the four aligning elements 14.

In use, the IC package 6 is preloaded into the second receiving cavity 10 of the socket body 1 leaded by the leading surfaces 143 of the aligning elements 14. The lower cover 22 is firstly rotated to a horizontal position by pivotal connection via the first holding shaft 26 between the lower cover 22 and the second end 19 of the socket body 1. The upper cover 21 is also rotated to a horizontal position to be seated on the lower cover 22 by pivotal movement via the second holding shaft 25 between the upper cover 21 and the front end 221 of lower cover 22, and at this moment, the hooks 213 of the upper cover 21 is locked by the ends of the crossbar 182. Then, the locking member 24 is urged to be pivotally rotated towards the second end 19 of the socket body 1 so as to tightly engage with the slot 110 of the socket body 1, thereby holding the IC package 6 securely sandwiched between the socket body 1 and the pressing member 3.

In such a configuration, it is obvious that the aligning elements 14 can be replaced by others having different dimensions and adapted for another different IC packages. Alternatively, to change positions of the aligning elements 14 in the bottom wall 13 of the insulative housing 11 is also applicable for different IC packages. Therefore, it is not needed to manufacture other new IC socket dies for different IC packages, just need to produce different aligning elements 14, thus a manufacturing cost is reduced and time is saved.

While preferred embodiment in accordance with the present invention has been shown and described, equivalent modifications and changes known to persons skilled in the art according to the spirit of the present invention are considered within the scope of the present invention as defined in the appended claims.

What is claimed is:

1. An IC socket, for interconnecting an IC package with a circuit substrate, comprising:
    a cover includes a lower cover and an upper cover pivotally mounted on a front end of the lower cover,
    a locking member assembled on a free end of the upper cover;
    an rectangular insulative housing having a first receiving cavity with a bottom wall; a plurality of terminals disposed in the bottom wall of the insulative housing with contacting sections extending upwardly into the first receiving cavity and to contact with the IC package loaded thereon;
    the housing defining opposite first and second longitudinal ends thereof, a cross bar located at the first end, a pair of spaced ribs arranged on the second longitudinal end with another a pair of longitudinally extending holes formed on the respective ribs to allow a first holding shaft to penetrate therethrough; the front end of the lower cover having longitudinally extending holes therein to allow a second holding shaft to penetrate therethrough to form a pivotal connection between the lower cover and the upper cover, a hook formed around a front end of the upper cover opposite to the free end of the upper cover for engagement with the crossbar;
    a plurality of detachable aligning elements disposed in the first receiving cavity of the insulative housing, said aligning elements having positioning surfaces cooperatively defining a second receiving cavity for snugly accommodating the IC package therein;

each aligning element further has two posts extending downwardly from bottom surfaces of the legs for being inserted into corresponding positioning holes defined in the bottom wall of the insulative housing, and a recessed portion is defined in a corner between the two legs of each aligning element to reduce a stress between the two posts.

2. The IC socket as claimed in claim 1, wherein said aligning elements are mounted on the bottom wall of the insulative housing in alignment with one another, and each aligning element has a substantially V-shaped configuration and includes two vertical legs having interior positioning surfaces toward the IC package.

3. The IC socket as claimed in claim 2, wherein the cover is made of metallic material.

4. The IC socket as claimed in claim 2, wherein the alignments elements can be located in different positions to be adapted with a different IC packages.

5. An IC socket, for interconnecting an IC package with a circuit substrate, comprising:
   a cover includes a lower cover and an upper cover pivotally mounted on a front end of the lower cover,
   a locking member engaged on a free end of the upper cover and having a claw which can be locked to the insulative housing; and
   an insulative housing including a bottom with a top surface, a first end and an opposite second end along a front-to-back direction; the upper cover pivotally engaged on a front end of the insulative housing; and
   a plurality of terminals disposed in the insulative housing with contacting sections extending beyond the top surface of the bottom;
   the housing defining opposite first and second longitudinal ends thereof, a cross bar located at the first end, a pair of spaced ribs arranged on the second longitudinal end with another pair of longitudinally extending holes formed on the respective ribs to allow a first holding shaft to penetrate therethrough; the front end of the lower cover having longitudinally extending holes therein to allow a second holding shaft to penetrate therethrough to form a pivotal connection between the lower cover and the upper cover;
   a plurality of detachable aligning elements disposed on the insulative housing, said aligning elements having positioning surfaces adapted to corporately define a receiving cavity for snugly accommodating an IC package therein;
   each aligning element further has two posts extending downwardly from bottom surfaces of the legs for being inserted into corresponding positioning holes defined in the bottom wall of the insulative housing, and a recessed portion is defined in a corner between the two legs of each aligning element to reduce a stress between the two posts.

6. The IC socket as claimed in claim 5, wherein the cover has a movable pressing member for retaining the IC package.

7. The IC socket as claimed in claim 5, wherein said aligning elements are mounted on the bottom wall of the insulative housing in alignment with one another, each aligning element has a substantially L-shaped configuration and includes two vertical legs having interior positioning surfaces toward the IC package.

8. The IC socket as claimed in claim 7, wherein the alignments elements can be located in different positions to be adapted with a different IC packages.

9. The IC socket as claimed in claim 7, wherein the cover is made of metallic material.

10. An IC socket, for interconnecting an IC package with a circuit substrate, comprising:
    an insulative housing defining an upward receiving cavity; and
    a plurality of contacts dispose in the housing facing the receiving cavity;
    a cover includes a lower cover and an upper cover pivotally mounted on a front end of the lower cover, and the lower cover pivotally mounted to the housing and equipped with a pressing board for holding the IC package in the receiving cavity;
    a locking member engaged on a free end of the upper cover and having a claw which can be locked to the insulative housing; and
    an insulative housing defining an upward receiving cavity; and
    a plurality of contacts dispose in the housing facing the receiving cavity;
    the housing defining opposite first and second longitudinal ends thereof, a cross bar located at the first end, a pair of spaced ribs is arranged on the second longitudinal end with another a pair of longitudinally extending holes formed on the respective ribs to allow a first holding shaft to penetrate therethrough; the front end of the lower cover having longitudinally extending holes therein to allow a second holding shaft to penetrate therethrough to form a pivotal connection between the lower cover and the upper cover; a hook formed around a front end of the upper cover opposite to the free end of the upper cover for engagement with crossbar;
    a plurality of detachable alignment elements arranged on corners of the receiving cavity, each of said alignment elements defining an L-shaped configuration in a top view with upward wedged edges for easy loading of said IC into the receiving cavity;
    each aligning element further has two posts extending downwardly from bottom surfaces of the legs for being inserted into corresponding positioning holes defined in the bottom wall of the insulative housing, and a recessed portion is defined in a corner between the two legs of each aligning element to reduce a stress between the two posts.

11. The IC socket as claimed in claim 10, wherein the alignments elements can be located in different positions to be adapted with a different IC packages.

* * * * *